United States Patent
Eto

(10) Patent No.: US 7,977,232 B2
(45) Date of Patent: Jul. 12, 2011

(54) SEMICONDUCTOR WAFER INCLUDING CRACKING STOPPER STRUCTURE AND METHOD OF FORMING THE SAME

(75) Inventor: Toyonori Eto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 241 days.

(21) Appl. No.: 12/314,010

(22) Filed: Dec. 2, 2008

(65) Prior Publication Data

US 2009/0146260 A1 Jun. 11, 2009

(30) Foreign Application Priority Data

Dec. 5, 2007 (JP) .............................. P2007-315051

(51) Int. Cl.
*H01L 21/768* (2006.01)
(52) U.S. Cl. ........ 438/622; 438/462; 438/643; 438/637; 438/627; 438/618; 438/629; 438/465; 438/460; 438/584; 438/E21.17; 438/619; 257/620; 257/E23.194; 257/E21.575; 257/E23.17; 257/E23.169; 257/773; 257/725; 257/775; 257/750; 257/774; 257/700; 257/383; 257/524
(58) Field of Classification Search .................. 257/620, 257/E23.194, E21.575, 776, 383, 750, 700, 257/524, E23.169; 438/622, 462, 637, 618, 438/629, 465, 460, 584, 638, 619
See application file for complete search history.

(56) References Cited

U.S. PATENT DOCUMENTS

| | | | |
|---|---|---|---|
| 6,951,801 B2 | 10/2005 | Pozder et al. | |
| 2004/0147097 A1 | 7/2004 | Pozder et al. | |
| 2005/0026397 A1* | 2/2005 | Daubenspeck et al. | 438/465 |
| 2005/0093169 A1* | 5/2005 | Kajita | 257/774 |
| 2005/0269702 A1* | 12/2005 | Otsuka | 257/750 |

FOREIGN PATENT DOCUMENTS

| | | |
|---|---|---|
| JP | 2005-260059 | 9/2005 |
| JP | 2006-516824 | 7/2006 |
| WO | 2004/073014 A2 | 8/2004 |
| WO | 2004/073014 A3 | 8/2004 |

* cited by examiner

*Primary Examiner* — Wael M Fahmy
*Assistant Examiner* — Marc Armand
(74) *Attorney, Agent, or Firm* — McGinn IP Law Group, PLLC

(57) ABSTRACT

A semiconductor wafer may include, but is not limited to, the following elements. A semiconductor substrate has a device region and a dicing region. A stack of inter-layer insulators may extend over the device region and the dicing region. Multi-level interconnections may be disposed in the stack of inter-layer insulators. The multi-level interconnections may extend in the device region. An electrode layer may be disposed over the stack of inter-layer insulators. The electrode layer may extend in the device region. The electrode layer may cover the multi-level interconnections. A cracking stopper groove may be disposed in the dicing region. The cracking stopper groove may be positioned outside the device region.

11 Claims, 6 Drawing Sheets

SEMICONDUCTOR WAFER INCLUDING CRACKING STOPPER STRUCTURE AND METHOD OF FORMING THE SAME

BACKGROUND OF THE INVENTION

1. Field of the Invention

The present invention generally relates to a semiconductor wafer and a method of forming the same. More specifically, the present invention relates to a semiconductor wafer including a cracking stopper structure and a method of forming the same.

Priority is claimed on Japanese Patent Application No. 2007-315051, filed Dec. 5, 2007, the content of which is incorporated herein by reference.

2. Description of the Related Art

In general, most of the semiconductor devices may include a semiconductor substrate, a device layer, and a multi-level interconnection layer. The device layer may be disposed over the semiconductor substrate. The device layer may include semiconductor elements such as transistors. The multi-level interconnection layer may be disposed over the device layer. The multi-level interconnection layer may include interconnections or wirings at plural different levels. In recent years, the multi-level interconnection layer may often have a damascene structure. In some cases, the multi-level interconnection layer with the damascene structure may include plural inter-layer insulators, barrier layers, metal interconnections, and via contacts. At least one of the inter-layer insulators other than the upper most inter-layer insulator may include a lower dielectric region that has a dielectric constant of less than 3.9. The lower dielectric region may be positioned at a level where the damascene structure is used. The barrier layers are disposed between the plural inter-layer insulators. The metal interconnections may typically be made of Cu. The metal interconnections may be formed in grooves of the inter-layer insulators. The via contacts may extend in the inter-layer insulators and between the metal interconnections at different levels. Typically, the via contacts extend in a direction vertical to the surface of the semiconductor substrate. In some cases, the inter-layer insulator may be made of, but not limited to, SiCO which is different from silicon oxide in that some Si—O bonding of silicon oxide is substituted with methyl groups. In some cases, the barrier layer may be made of, but not limited to, SiCN.

Adhesiveness is low between the SiCO film as the inter-layer insulator and the SiCN film as the barrier layer. The low adhesiveness between the inter-layer insulator and the barrier layer may cause that the inter-layer insulator and the barrier layer are peeled from each other in the process of dicing the semiconductor wafer, thereby deteriorating the moisture resistance of the semiconductor chip. A countermeasure to the possible peeling between the inter-layer insulator and the barrier layer is to provide a cracking stopper to the wafer. The cracking stopper is a groove which extends along the circumference of the semiconductor chip. In some cases, the cracking stopper groove has such a depth that the bottom of the cracking stopper groove is just above the first level interconnection.

The semiconductor manufacturing processes may include a process for forming openings in an uppermost passivation film, wherein the openings are positioned directly over bonding pads. The process for forming the openings in the uppermost passivation film can be carried out by an etching process using an etching mask that is disposed over the uppermost passivation film. This etching mask is also used to form the cracking stopper groove. Namely, the openings and the cracking stopper groove are formed in the same etching process. Such a wide width of the groove as a few micrometers will be necessary to obtain a deep depth of the groove by the single etching process. Increase of the width of the groove will decrease the effective or useful area for the chips in a single wafer, thereby decreasing the number of chips obtained from the single wafer.

If it is intended to reduce the number of used masks to the minimum number, a mask has to be disposed on the passivation film, thereby causing a residual on the dicing line, wherein the residual is of the material such as polyimide for the passivation film. The residual of the material such as polyimide will shorten the lifetime of a dicing saw.

Japanese Unexamined Patent Application, First Publication, No. 2005-260059 discloses that grooves extend on dicing regions entirely. Namely, the dicing regions are entirely etched. This method makes it unnecessary to use the additional mask over the passivation film. The dicing regions may often include a pattern of terminals for wafer test. The dicing regions are entirely etched, while the pattern of terminals is also etched, thereby making it difficult or impossible to conduct the wafer test.

Japanese Unexamined Patent Application, First Publication, No. 2006-516824 discloses that an interconnection portion of the dicing region is removed by a wet etching process to selectively form a groove structure, while a pattern of terminals for wafer test is also removed.

SUMMARY

In one embodiment, a semiconductor wafer may include, but is not limited to, the following elements. A semiconductor substrate has a device region and a dicing region. A stack of inter-layer insulators may extend over the device region and the dicing region. Multi-level interconnections may be disposed in the stack of inter-layer insulators. The multi-level interconnections may extend in the device region. An electrode layer may be disposed over the stack of inter-layer insulators. The electrode layer may extend in the device region. The electrode layer may cover the multi-level interconnections. A cracking stopper groove may be disposed in the dicing region. The cracking stopper groove may be positioned outside the device region.

In another embodiment, a semiconductor wafer may include, but is not limited to, the following elements. A semiconductor substrate has a device region and a dicing region. A device layer may be disposed on the semiconductor substrate. The device layer may extend over the device region and the dicing region. A multi-level interconnection layer may be disposed on the device layer. The multi-level interconnection layer may extend over the device region and the dicing region. An electrode layer may be disposed on the multi-level interconnection layer. The electrode layer may extend in the device region. The multi-level interconnection layer may include, but is not limited to, the following elements. A stack of inter-layer insulators may extend over the device region and the dicing region. Multi-level interconnections may be formed in the stack of inter-layer insulators. The multi-level interconnections may extend in the device region. An electrode layer may be disposed over the stack of inter-layer insulators. The electrode layer may extend in the device region. The electrode layer may cover the multi-level interconnections. A cracking stopper groove may be disposed in the dicing region. The cracking stopper groove may be positioned outside the device region and inside a dicing line of the semiconductor wafer. The cracking stopper groove may include a portion having a shape that is defined by removing a multi-level interconnection structure in the dicing region.

In still another embodiment, a method of forming a semiconductor wafer may include, but is not limited to, the following processes. A stack of inter-layer insulators may be formed, which extends over a device region and a dicing region of a semiconductor substrate. First and second multi-level interconnection structures may be formed in the stack of inter-layer insulators. The first multi-level interconnection structure may be positioned in the device region. The second multi-level interconnection structure may be positioned in the dicing region. An electrode layer may be formed over the stack of inter-layer insulators. The electrode layer may extend in the device region. The electrode layer may cover the multi-level interconnections. The second multi-level interconnection structure may be removed to form a cracking stopper groove in the dicing region.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teaching of the present invention and that the invention is not limited to the embodiments illustrated for explanatory purpose.

[Semiconductor Wafer]

Figure 1C:
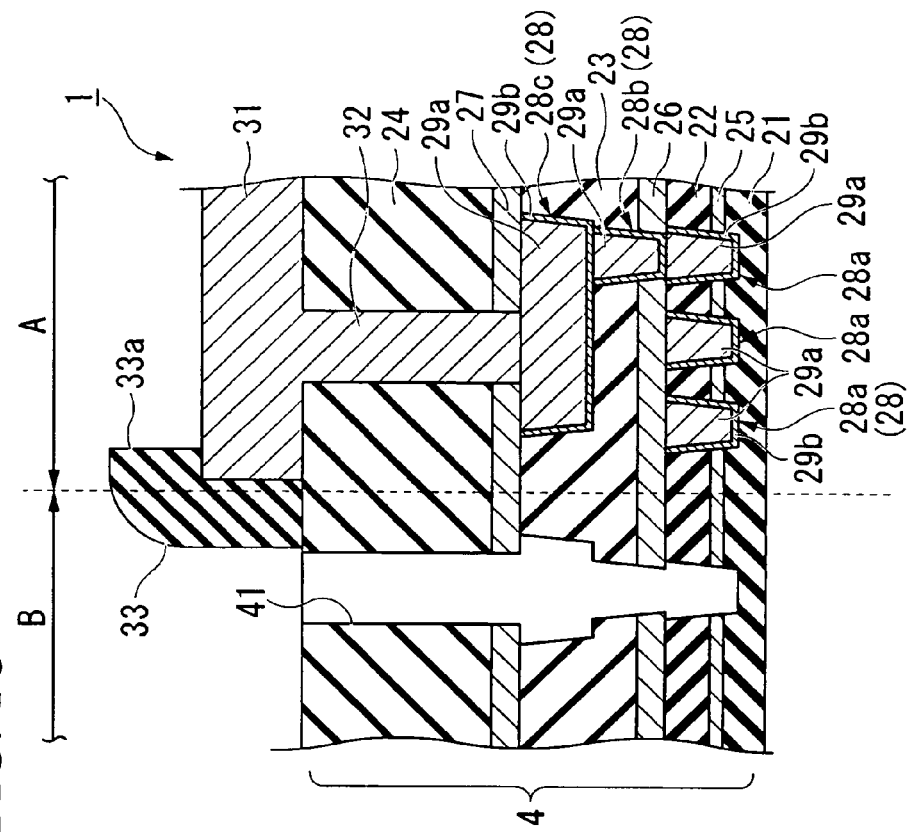
FIG. 1C is a fragmentary cross sectional elevation view illustrating the structure of the multi-level interconnection layer included in the semiconductor wafer of FIGS. 1A and 1B in accordance with a first preferred embodiment of the present invention.
Figure 1A:
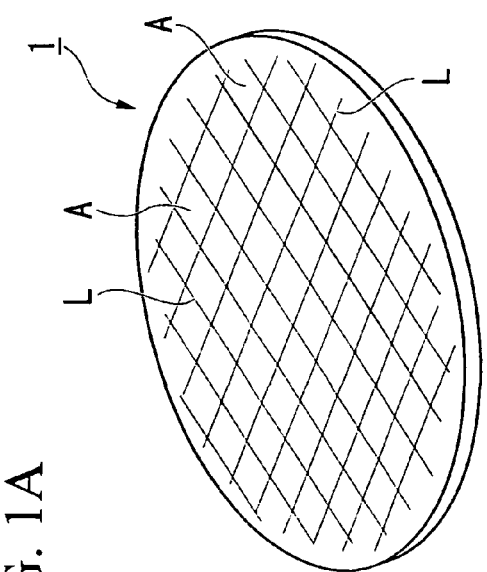
FIG. 1A is a schematic perspective view illustrating a semiconductor wafer in accordance with a first preferred embodiment of the present invention.
Figure 1B:
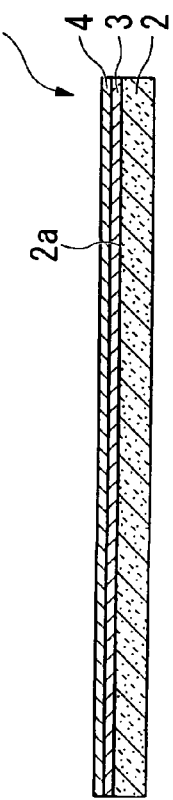
FIG. 1B is a cross sectional elevation view illustrating the semiconductor wafer of FIG. 1A.

FIG. 1A is a schematic perspective view illustrating a semiconductor wafer. FIG. 1B is a cross sectional elevation view illustrating the semiconductor wafer of FIG. 1A. A semiconductor wafer 1 may include, but is not limited to, a semiconductor substrate 2, a device layer 3, and a multi-level interconnection layer 4. The device layer 3 may be disposed over a main face 2a of the semiconductor substrate 2. The multi-level interconnection layer 4 may be disposed over the device layer 3. The device layer 3 may include, but is not limited to, isolation structures, and semiconductor devices such as transistors and capacitors. In some cases, the semiconductor wafer 1 may include, but is not limited to, semiconductor chips having dynamic random access memories DRAMs. In this case, the device layer 3 may include, but is not limited to, memory cells having each a transistor and a capacitor. The multi-level interconnection layer 4 includes interconnections for the semiconductor devices included in the device layer 3.

FIG. 1C is a fragmentary cross sectional elevation view illustrating the structure of the multi-level interconnection layer 4 included in the semiconductor wafer 1 of FIGS. 1A and 1B in accordance with a first preferred embodiment of the present invention. With reference to FIGS. 1A and 1C, the semiconductor wafer 1 may include, but is not limited to, an array of device regions A, each being defined by a dicing region B. Two adjacent device regions A are separated by the dicing region B from each other. The device regions A correspond to main parts of the semiconductor chips diced from the semiconductor wafer 1. Memory cells and other semiconductor devices are integrated in the device layer 3 in the device region A. The dicing region B surrounds the device region A. The dicing region B may have a dicing line L for allowing the semiconductor wafer 1 is diced along the dicing line L into the semiconductor chips each having the device region A.

With reference to FIG. 1C, the multi-level interconnection layer 4 in the semiconductor wafer 1 may be formed by a damascene method. The multi-level interconnection layer 4 extends over the device region A and the dicing region B. In some cases, the multi-level interconnection layer 4 may include, but is not limited to, first, second, third and fourth inter-layer insulators 21, 22, 23, and 24, and first, second and third barrier layers 25, 26 and 27, and first-level, second-level, and third-level metal interconnections 28. In general, at least one of the second and third inter-layer insulators 22 and 23 may include a lower dielectric region that has a dielectric constant of less than 3.9. The lower dielectric region may be positioned at a level where the damascene structure is used. In some cases, the second and third inter-layer insulators 22 and 23 may each have a dielectric constant of less than 3.9. The first barrier layer 25 may be disposed over the first inter-layer insulator 21. The second inter-layer insulator 22 may be disposed over the first barrier layer 25. The second barrier layer 26 may be disposed over the second inter-layer insulator 22. The third inter-layer insulator 23 may be disposed over the second barrier layer 26. The third barrier layer 27 may be disposed over the third inter-layer insulator 23. The fourth inter-layer insulator 24 may be disposed over the third barrier layer 27. The first-level interconnections 28a penetrate the first barrier layer 25 and the second inter-layer insulator 22. The second-level interconnection 28b penetrates second barrier layer 26. The combination of the second-level and third-level interconnections 28b and 28c penetrates the third inter-layer insulator 23.

The first-level interconnections 28a are buried in the first and second inter-layer insulators 21 and 22. The combination of the second-level and third-level interconnections 28b and 28c is buried in the third inter-layer insulator 23. The third-level interconnection 28c is positioned directly over the second-level interconnection 28b so that the third-level interconnection 28c contacts with the second-level interconnection 28b. The second-level interconnection 28b is positioned directly over the first-level interconnection 28a so that the second-level interconnection 28b contacts with the first-level interconnection 28a. The third-level interconnection 28c is connected through the second-level interconnection 28b to the first-level interconnection 28a. A set of the first-level, second-level, and third-level interconnections 28a, 28b and 28c penetrate the second and third inter-layer insulators 22 and 23. Each of the first-level, second-level and third-level interconnections 28a, 28b and 28c may include, but is not limited to, an interconnection metal layer 29a and a metal barrier layer 29b. The metal barrier layer 29b covers the side and bottom walls of the interconnection metal layer 29a so that the metal barrier layer 29b separates the interconnection metal layer 29a from the first, second or third inter-layer insulators 21, 22, and 23.

The first-level interconnections 28a are formed in first-level grooves. The first-level grooves penetrate the second inter-layer insulator 22 and the first barrier layer 25 and reach the first inter-layer insulator 21. The metal barrier layer 29b is formed on the inside walls of the first-level grooves. A seed layer is formed on the metal barrier layer 29b. The seed layer is not illustrated. The seed layer is used as an electrode in a plating method, to form the interconnection metal layer 29a on the seed layer that is disposed on the metal barrier layer 29b in the first-level grooves.

The second-level interconnection 28b is formed in a second-level groove. The second-level groove penetrates a lower portion of the second inter-layer insulator 22 and the second barrier layer 26 and reach the first-level interconnection 28a. The metal barrier layer 29b is formed on the inside walls of the second-level groove. A seed layer is formed on the metal barrier layer 29b. The seed layer is not illustrated. The seed layer is used as an electrode in a plating method, to form the interconnection metal layer 29a on the seed layer that is disposed on the metal barrier layer 29b in the second-level groove.

The third-level interconnection 28c is formed in a third-level groove. The third-level groove penetrates an upper portion of the second inter-layer insulator 22 and reach the second-level interconnection 28b. The third-level groove is wider than the second-level groove. The metal barrier layer 29b is formed on the inside walls of the third-level groove. A seed layer is formed on the metal barrier layer 29b. The seed layer is not illustrated. The seed layer is used as an electrode in a plating method, to form the interconnection metal layer 29a on the seed layer that is disposed on the metal barrier layer 29b in the third-level groove.

Thus, the first-level, second-level, and third-level interconnections 28a, 28b, and 28c can be formed by the damascene method as described above.

In some cases, the second and third inter-layer insulators 22 and 23 may each be realized by, but not limited to, a low dielectric film that has a dielectric constant of less than 3.9. The low dielectric film may be made of, but not limited to, SiCO. The first, second and third barrier layers 25, 26, and 27 may preferably prevent diffusion of metal atoms from the interconnection metal layer 29a. In some cases, the first, second and third barrier layers 25, 26, and 27 may have a dielectric constant of not greater than 5.5. The first, second and third barrier layers 25, 26, and 27 may be made of, but not limited to, SiCN. The metal barrier layer 29b may preferably prevent diffusion of metal atoms from the interconnection metal layer 29a. In some cases, the metal barrier layer 29b may be made of, but not limited to, Ta. The seed layer may preferably be made of the same material as the interconnection metal layer 29a. The interconnection metal layer 29a may preferably be made of a highly conductive material. In some cases, the interconnection metal layer 29a and the seed layer may be made of, but not limited to, Cu.

A metal layer 31 may be disposed over the fourth inter-layer insulator 24. The metal layer 31 extends in the device region A. The metal layer 31 may perform as a bonding pad and a test terminal. In some cases, the metal layer 31 may preferably be made of a metal that is highly resistive to wet etching as compared to the interconnections 28. The metal layer 31 may be made of, but not limited to, aluminum which is highly resistive to an etchant of a nitric acid.

A contact plug 32 penetrates the fourth inter-layer insulator 24 and the third barrier layer 27. The contact plug 32 reaches the third-level interconnection 28c. The contact plug 32 connects the metal layer 31 and the third-level interconnection 28c. Namely, the metal layer 31 performing as a bonding pad and a test terminal is electrically connected through the contact plug 32 to the multi-level interconnections 28. The contact plug 32 performs as a metal interconnection.

A passivation film 33 may be disposed over the fourth inter-layer insulator 24 and the metal layer 31. The passivation film 33 may have an opening 33a which is positioned directly over the metal layer 31, so as to allow the metal layer 31 to perform as a bonding pad and a test terminal.

With reference to FIG. 1C, a cracking stopper groove 41 may be disposed in the dicing region B of the multi-level interconnection layer 4. The cracking stopper groove 41 can perform as a cracking stopper. In some cases, the cracking stopper groove 41 can be formed by removing multi-level interconnections 28 and a contact plug 32 in the dicing region B of the multi-level interconnection layer 4. In plan view, the cracking stopper groove 41 may surround each device region A. The cracking stopper groove 41 may extend along the circumference of each device region A. The dicing line L may surround the cracking stopper groove 41 that surround each device region A. The dicing line L may extend along the circumference of the cracking stopper groove 41 that extend along the circumference of each device region A. The cracking stopper groove 41 may extend inside the dicing line L and outside each device region A. The cracking stopper groove 41 may extend between the dicing line L and each device region A. In vertical view, the cracking stopper groove 41 penetrates the fourth inter-layer insulator 24, the third barrier layer 27, the third inter-layer insulator 23, the second barrier layer 26, the second inter-layer insulator 22, and the first barrier layer 25, and reaches the first inter-layer insulator 21.

When the semiconductor wafer 1 may be diced by a dicing saw along the dicing line L, it is possible that any crack is caused at the dicing line L in the multi-level interconnection layer 4, and/or that any peeling is caused at the dicing line L between the first, second, third and fourth inter-layer insulators 21, 22, 23, and 24 and the first, second and third barrier layers 25, 26, and 27. The crack and/or the peeling may propagate in horizontal directions that are parallel to the surface of the semiconductor substrate 2. The propagation of the crack and/or the peeling can be terminated by the cracking stopper groove 41. Namely, the cracking stopper groove 41 stops further propagation of the rack and/or the peeling to each device region A. The cracking stopper groove 41 can protect each device region A from the crack and/or the peeling.

When the cracking stopper groove 41 is formed by removing the multi-level interconnections 28 and the contact plug 32 in the dicing region B of the multi-level interconnection layer 4, the cracking stopper groove 41 may have a width that is substantially the same as the widths of the multi-level interconnections 28 in the dicing region B. In some cases, the multi-level interconnections 28 and the contact plug 32 in the dicing region B are formed in the common processes to the multi-level interconnections 28 and the contact plug 32 in the device region A. In this case, the position of the cracking stopper groove 41 in the dicing region B is determined at the same process for forming the multi-level interconnections 28 and the contact plug 32 in the device region A. Usually, there appears to be risen no problem of alignment margin between the groove 41 in the dicing region B and the multi-level interconnections 28 and the contact plug 32 in the device region A.

[Process of Forming Semiconductor Wafer]

A method of forming a semiconductor wafer 1 of FIGS. 1A, 1B, and 1C will be described with reference to FIGS. 2-9. The method of forming the semiconductor wafer 1 of FIGS. 1A, 1B, and 1C may generally include, but is not limited to, a process for forming multi-level interconnection layers, a process for forming an electrode layer, a process for forming a cracking stopper groove, and a process for forming a passivation film.

(Process for Forming Multi-Level Interconnection Layers)

The process for forming multi-level interconnection layers may include, but is not limited to, forming, a multi-level interconnection layer 4 over the main face 2a of the semiconductor substrate 2. The multi-level interconnection layer 4 may include, but is not limited to, first, second, third and fourth inter-layer insulators 21, 22, 23, and 24, and first, second and third barrier layers 25, 26 and 27, and first-level, second-level, and third-level metal interconnections 28. In general, at least one of the second and third inter-layer insulators 22 and 23 may include a lower dielectric region that has a dielectric constant of less than 3.9. In some cases, the second and third inter-layer insulators 22 and 23 may each have a dielectric constant of less than 3.9. The multi-level interconnection layer 4 can be formed over the main face 2a of the semiconductor substrate 2 by the damascene method.

With reference again to FIG. 1B, the semiconductor substrate 2 having the device region A and the dicing region B is prepared. After the device layer 3 is formed on the main face 2a of the semiconductor substrate 2, the multi-level interconnection layer 4 is formed on the device layer 3.

Figure 2:
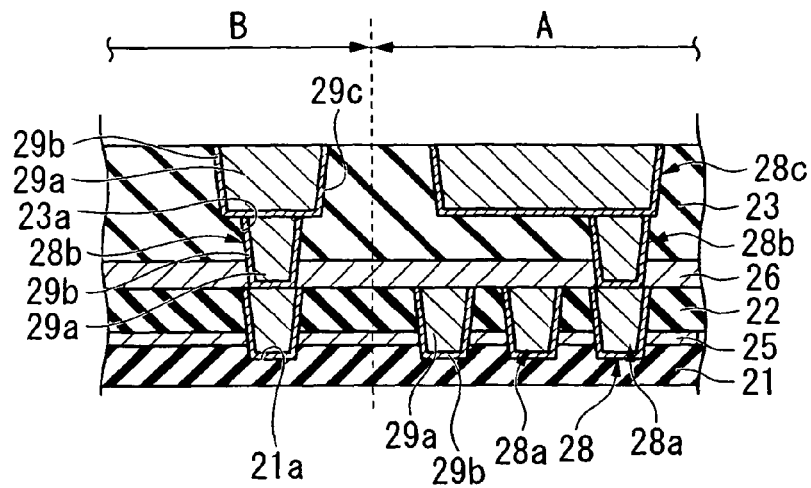
FIG. 2 is a fragmentary cross sectional elevation view illustrating a semiconductor wafer in a step involved in the method of forming the semiconductor wafer in accordance with the first preferred embodiment of the present invention.

With reference to FIG. 2, a first inter-layer insulator 21 is formed over the device layer 3 that is formed over the main face 2a of the semiconductor substrate 2. A first barrier layer 25 is formed over the first inter-layer insulator 21. A second inter-layer insulator 22 is formed over the first barrier layer 25. The second inter-layer insulator 22 has a dielectric constant of less than 3.9. Grooves 21a are formed which penetrate the second inter-layer insulator 22 and the first barrier layer 25 and reaches the first inter-layer insulator 21. One of the grooves 21a is positioned in the dicing region B, and the remainder three grooves 21a are positioned in the device region A. A metal barrier layer 29b is formed, which covers the side and bottom walls of each groove 21a. A seed layer is formed on the metal barrier layer 29b. The seed layer is not illustrated. A plating process is carried out by applying a current to the seed layer, thereby forming an interconnection metal layer 29a on the metal barrier layer 29b. A chemical mechanical polishing process is carried out to planarize the interconnection metal layer 29a, thereby forming first-level interconnections 28a in the grooves 21a.

A second barrier layer 26 is formed over the second inter-layer insulator 22. A third inter-layer insulator 23 is formed over the second barrier layer 26. The third inter-layer insulator 23 has a dielectric constant of less than 3.9. Grooves 23a are formed which penetrate the third inter-layer insulator 23 and the second barrier layer 26. One of the grooves 23a is positioned in the dicing region B, and the remainder groove 23a is positioned in the device region A.

A metal barrier layer 29b is formed, which covers the side and bottom walls of each groove 23a. A seed layer is formed on the metal barrier layer 29b. The seed layer is not illustrated. A plating process is carried out by applying a current to the seed layer, thereby forming an interconnection metal layer 29a on the metal barrier layer 29b. A chemical mechanical polishing process is carried out to planarize the interconnection metal layer 29a, thereby forming second-level and third-level interconnections 28b and 28c in the grooves 23a. The second-level interconnections 28b extend through the deeper portions of the grooves 23a. The third-level interconnections 28b extend through the shallower portions of the grooves 23a. The third-level interconnections 28b are positioned above the second-level interconnections 28b. The third-level interconnections 28b contact with the second-level interconnections 28b. One of the second-level interconnections 28b in the device region A is positioned over one of the first-level interconnections 28a in the device region A. One of the second-level interconnections 28b in the device region A contacts with one of the first-level interconnections 28a in the device region A. The remainder one of the second-level interconnections 28b in the dicing region B is positioned over the first-level interconnections 28a in the dicing region B. The remainder one of the second-level interconnections 28b in the dicing region B contacts with the first-level interconnections 28a in the dicing region B.

A set of the first-level, second-level, and third-level interconnections 28a, 28b and 28c penetrate the third inter-layer insulator 23, the second barrier layer 26, the second inter-layer insulator 22 and the first barrier layer 25 and reaches the first inter-layer insulator 21. The set of the first-level, second-level, and third-level interconnections 28a, 28b and 28c constitutes the interconnections 28 that penetrate the first, second, third and fourth inter-layer insulators 21, 22, 23, and 24.

The set of the first-level, second-level, and third-level interconnections 28a, 28b and 28c is formed in each of the device region A and the dicing region B. In plan view, the set of the first-level, second-level, and third-level interconnections 28a, 28b and 28c in the dicing region B surrounds the set of the first-level, second-level, and third-level interconnections 28a, 28b and 28c in the device region A. In plan view, the set of the first-level, second-level, and third-level interconnections 28a, 28b and 28c in the dicing region B is positioned inside the dicing line L and outside the set of the first-level, second-level, and third-level interconnections 28a, 28b and 28c in the device region A.

Figure 3:
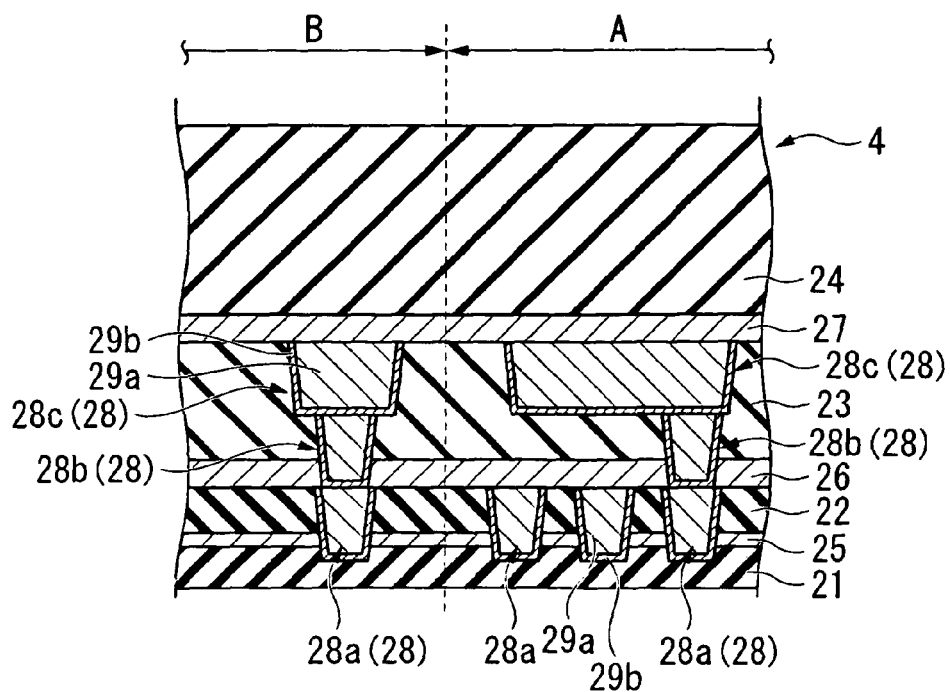
FIG. 3 is a fragmentary cross sectional elevation view illustrating a semiconductor wafer in a step subsequent to the step of FIG. 2, involved in the method of forming the semiconductor wafer in accordance with the first preferred embodiment of the present invention.

With reference to FIG. 3, a third barrier layer 27 is formed over the third inter-layer insulator 23 and the interconnections 28. A fourth inter-layer insulator 24 is formed over the third barrier layer 27. The multi-level interconnection layer 4 extends over the device region A and the dicing region B.

(Process for Forming Electrode Layer)

The process for forming an electrode layer may include, but is not limited to, a process for forming an electrode layer 31 that extends over the multi-level interconnection layer 4 in the device region A, wherein the electrode layer 31 is connected through a contact plug 32 to the interconnections 28 in the multi-level interconnection layer 4. The electrode layer 31 can perform as a bonding pad and a test terminal.

Figure 4:
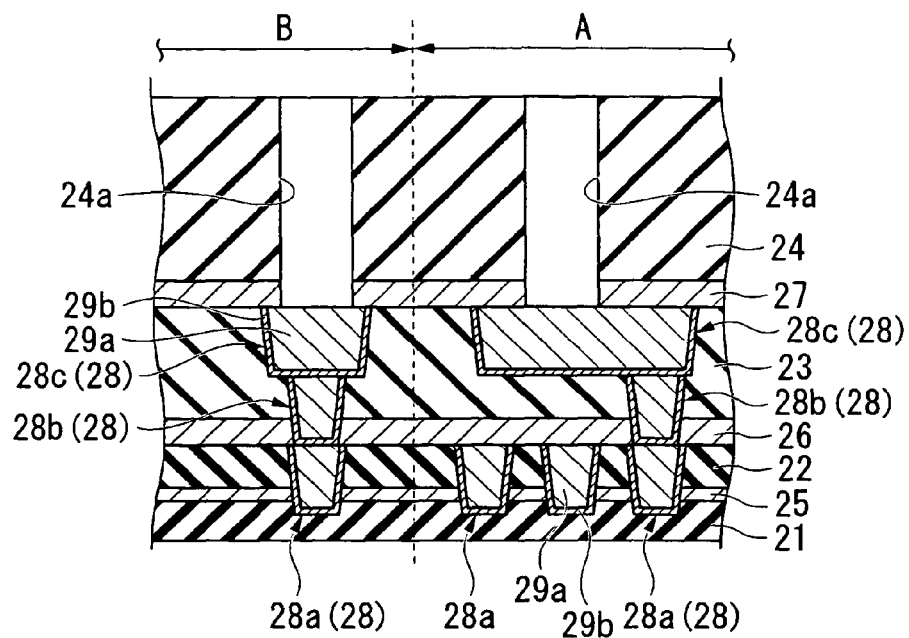
FIG. 4 is a fragmentary cross sectional elevation view illustrating a semiconductor wafer in a step subsequent to the step of FIG. 3, involved in the method of forming the semiconductor wafer in accordance with the first preferred embodiment of the present invention.

With reference to FIG. 4, an etching process is carried out using a resist mask to form penetrating holes 24a, which penetrate the fourth inter-layer insulator 24 and the third barrier layer 27, so that the penetrating holes 24a reach the third-level interconnections 28c. The penetrating holes 24a are provided in the device region A and the dicing region B. The penetrating hole 24a in the device region A reaches the third-level interconnection 28c in the device region A. The penetrating hole 24a in the dicing region B reaches the third-level interconnection 28c in the dicing region B.

Figure 5:
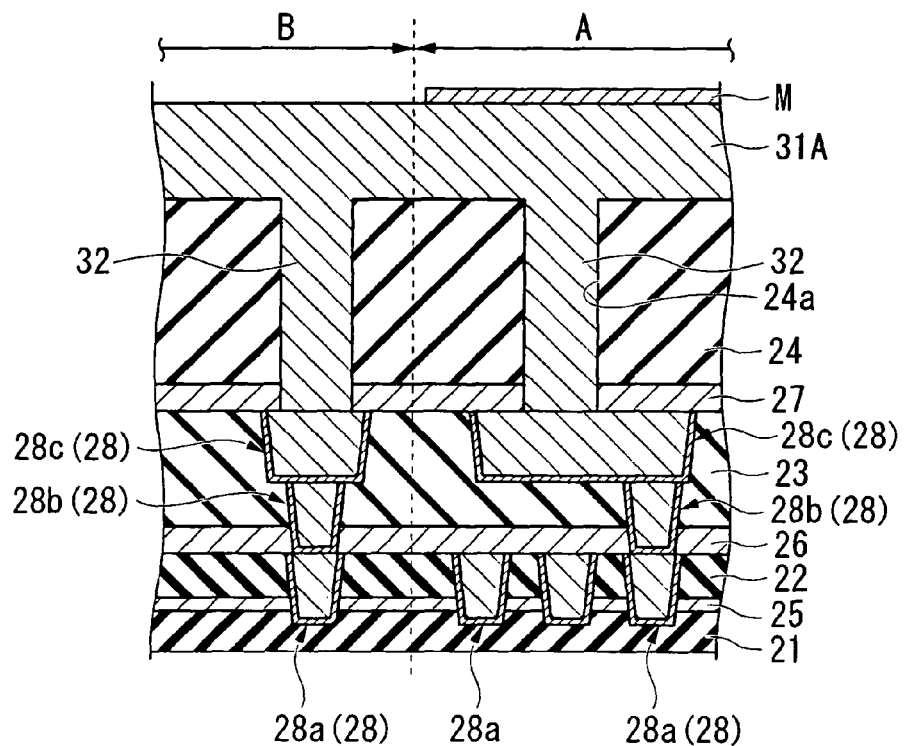
FIG. 5 is a fragmentary cross sectional elevation view illustrating a semiconductor wafer in a step subsequent to the step of FIG. 4, involved in the method of forming the semiconductor wafer in accordance with the first preferred embodiment of the present invention.

With reference to FIG. 5, an electrode film 31A and contact plugs 32 are formed by an evaporation method or a sputtering method. The electrode film 31A extends over the fourth inter-layer insulator 24, while the contact plugs 32 are formed in the penetrating holes 24a. The contact plugs 32 contact with the third-level interconnections 28c in the device region A and the dicing region B. The electrode film 31A and the contact plugs 32 may be made of, but are not limited to, Al. The electrode film 31A is electrically connected through the contact plugs 32 to the third-level interconnections 28c in the device region A and the dicing region B. A mask layer M is selectively formed, which extends over the electrode film 31A but in the device region A. It is optional that an adhesive layer TiN may be formed between the electrode film 31A and the fourth inter-layer insulator 24.

Figure 6:
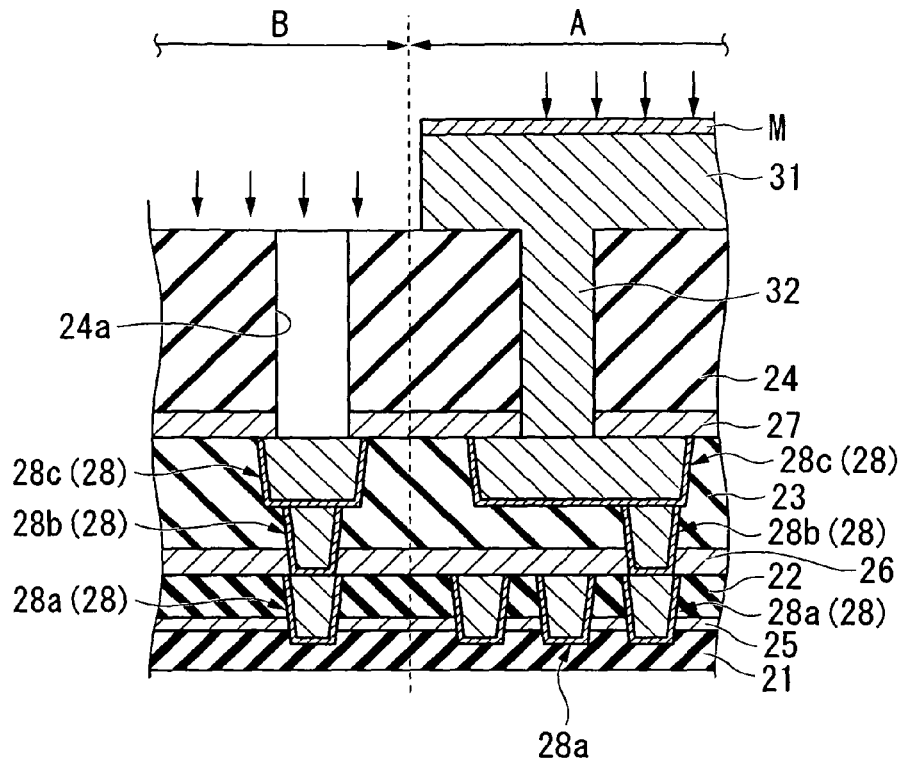
FIG. 6 is a fragmentary cross sectional elevation view illustrating a semiconductor wafer in a step subsequent to the step of FIG. 5, involved in the method of forming the semiconductor wafer in accordance with the first preferred embodiment of the present invention.

With reference to FIG. 6, an anisotropic etching process is carried out using the mask layer M that covers the device region A, so as to selectively etch the electrode film 31A and the contact plug 32 in the dicing region B, while leaving the electrode film 31A in the device region A. As a result of the anisotropic etching process, an electrode layer 31 is selectively formed over the fourth inter-layer insulator 24, wherein the electrode layer 31 extends over the device region A, without extending over the dicing region B. Namely, the electrode film 31A and the contact plug 32 in the dicing region B are removed, so that the penetrating hole 24a is again made in the dicing region B, and the third-level interconnection 28c in the dicing region B is exposed.

Figure 7:
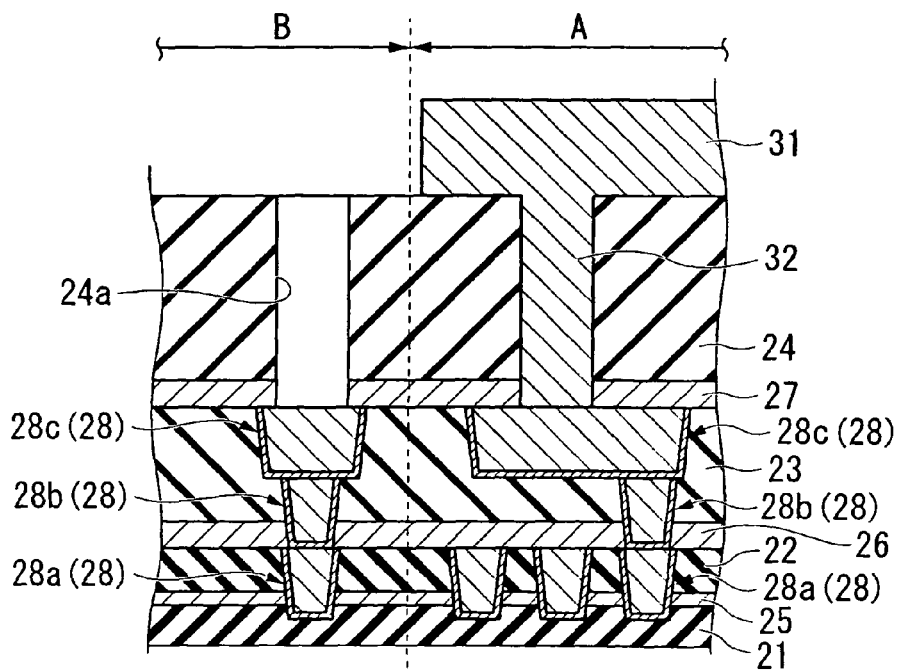
FIG. 7 is a fragmentary cross sectional elevation view illustrating a semiconductor wafer in a step subsequent to the step of FIG. 6, involved in the method of forming the semiconductor wafer in accordance with the first preferred embodiment of the present invention.

With reference to FIG. 7, the mask layer M is removed from the surface of the electrode layer 31.

(Process for Forming Cracking Stopper Groove)

Figure 8:
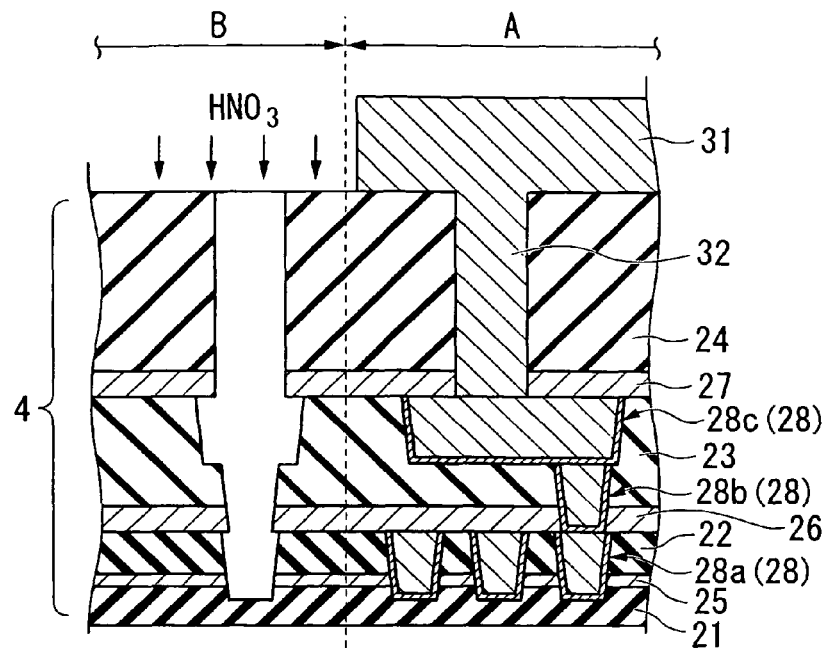
FIG. 8 is a fragmentary cross sectional elevation view illustrating a semiconductor wafer in a step subsequent to the step of FIG. 7, involved in the method of forming the semiconductor wafer in accordance with the first preferred embodiment of the present invention.

With reference to FIG. 8, a cracking stopper groove 41 is formed in the dicing region B by removing the contact plug 32 and the first-level, second-level and third-level interconnections 28a, 28b, and 28c in the dicing region B. Removal of the contact plug 32 and the first-level, second-level and third-level interconnections 28a, 28b, and 28c in the dicing region B to form a cracking stopper groove 41 in the dicing region B can be carried out by, but not limited to, carrying out an etching process using the electrode layer 31 as a mask.

The etching process can be realized by a wet etching process using an nitric acid as an etchant. The etchant can be selected from chemicals that dissolve the materials of the contact plug 32 and the first-level, second-level and third-level interconnections 28a, 28b, and 28c, without dissolving the electrode layer 31. Typically, the electrode layer 31 may be made of Al, while the contact plug 32 and the first-level, second-level and third-level interconnections 28a, 28b, and 28c may be made of Cu. In this case, the nitric acid can be used as an etchant for wet etching process. The nitric acid dissolves Cu, while the nitric acid does not dissolve Al, wherein the surface of Al becomes a passive state that can not be dissolved by the nitric acid. The wet etching process is carried out using the nitric acid as an etchant and using the electrode layer 31 as a mask, so that the surface of the electrode layer 31 of Al becomes passive state and the electrode layer 31 is not etched by the nitric acid, while the contact plug 32 and the first-level, second-level and third-level interconnections 28a, 28b, and 28c of Cu in the dicing region B are dissolved and removed by the nitric acid, thereby forming the cracking stopper groove 41 in the dicing region B. In plan view, the cracking stopper groove 41 may surround each device region A. The cracking stopper groove 41 may extend along the circumference of each device region A. The dicing line L may surround the cracking stopper groove 41 that surround each device region A. The dicing line L may extend along the circumference of the cracking stopper groove 41 that extend along the circumference of each device region A. The cracking stopper groove 41 may extend inside the dicing line L and outside each device region A. The cracking stopper groove 41 may extend between the dicing line L and each device region A. In vertical view, the cracking stopper groove 41 penetrates the fourth inter-layer insulator 24, the third barrier layer 27, the third inter-layer insulator 23, the second barrier layer 26, the second inter-layer insulator 22, and the first barrier layer 25, and reaches the first inter-layer insulator 21. The cracking stopper groove 41 may perform as a cracking stopper.

In the above-described wet etching process, the electrode layer 31 covers the multi-level interconnection layer 4 in the device region A. The electrode layer 31 protects the multi-level interconnection layer 4 in the device region A from the etchant of nitric acid. Namely, the electrode layer 31 prevents the etchant of nitric acid from being infiltrated into the multi-level interconnection layer 4. The electrode layer 31 prevents the etchant of nitric acid from etching the contact plug 32 and the first-level, second-level and third-level interconnections 28a, 28b, and 28c in the device region A.

It is optional that the adhesive layer of TiN may be interposed between the electrode layer 31 and the fourth inter-layer insulator 24. The dissolution rate of TiN to the nitric acid is not greater than about 1 nm/sec. The adhesive layer of TiN also protects the multi-level interconnection layer 4 in the device region A from the etchant of nitric acid. Namely, the adhesive layer of TiN prevents the etchant of nitric acid from being infiltrated into the multi-level interconnection layer 4. The adhesive layer of TiN prevents the etchant of nitric acid from etching the contact plug 32 and the first-level, second-level and third-level interconnections 28a, 28b, and 28c in the device region A. The combination of the adhesive layer of TiN with the electrode layer 31 prevents the etchant of nitric acid from etching the contact plug 32 and the first-level, second-level and third-level interconnections 28a, 28b, and 28c in the device region A.

(Process for Forming Passivation Film)

Figure 9:
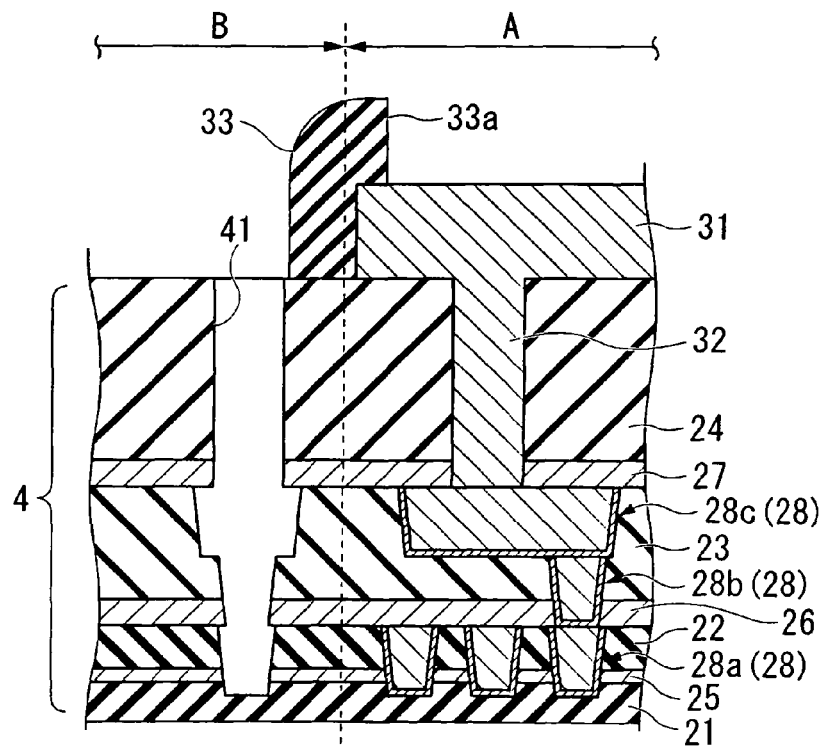
FIG. 9 is a fragmentary cross sectional elevation view illustrating a semiconductor wafer in a step subsequent to the step of FIG. 8, involved in the method of forming the semiconductor wafer in accordance with the first preferred embodiment of the present invention.

With reference to FIG. 9, a passivation film 33 is selectively formed on the surface and side walls of the electrode layer 31.

The passivation film 33 may be made of polyimide or silicon oxynitride. An opening 33a is formed in the passivation film 33. The opening 33a is positioned directly over the metal layer 31, so as to allow the metal layer 31 to perform as a bonding pad and a test terminal. As a result, the semiconductor wafer 1 is obtained.

[Process of Dicing Semiconductor Wafer]

Figure 10:
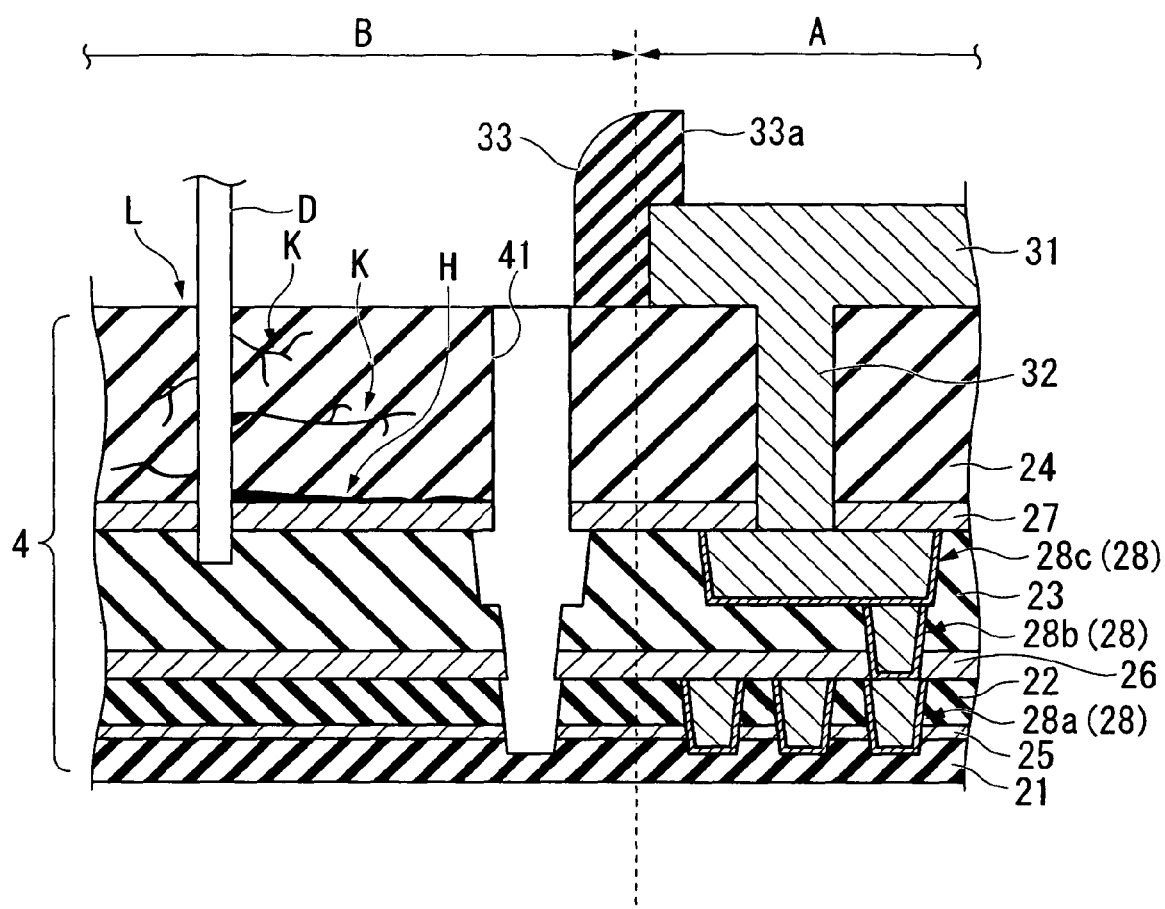
FIG. 10 is a fragmentary cross sectional elevation view illustrating a semiconductor wafer being cut by a cutting saw, while cracks and peel being caused.

With reference to FIG. 10, a dicing saw D is positioned on the dicing line L of the semiconductor wafer 1. The dicing saw D cuts the semiconductor wafer 1 along the dicing line L. The dicing saw D moves down relative to the semiconductor wafer 1 along the dicing line L, so that the dicing saw D cuts into the semiconductor wafer 1 along the dicing line L, while cracks K and/or peeling H may often be caused at the dicing line L as shown in FIG. 10. The cracks K may often be caused in the fourth, third, and second inter-layer insulators 24, 23, and 22. The peeling H may often be caused at the interface between the fourth inter-layer insulator 24 and the third barrier layer 27. The peeling H may also be caused at the interface between the third barrier layer 27 and the third inter-layer insulator 23. The peeling H may also be caused at the interface between the third inter-layer insulator 23 and the second barrier layer 26. The peeling H may also be caused at the interface between the second barrier layer 26 and the second inter-layer insulator 22. The peeling H may also be caused at the interface between the second inter-layer insulator 22 and the first barrier layer 25. The peeling H may also be caused at the interface between the first barrier layer 25 and the first inter-layer insulator 21.

The cracks K will propagate through the fourth, third, and second inter-layer insulators 24, 23, and 22 in the horizontal direction mainly. The propagation of crack K from the dicing line L will, however, be terminated by the cracking stopper groove 41. No further propagation of the crack K beyond the cracking stopper groove 41 toward the device region A is caused. The cracking stopper groove 41 prevents the cracks K to propagate into the device region A. The cracking stopper groove 41 protects the device region A from the propagation of the cracks K.

The peeling H will propagate through the interfaces between the fourth, third, and second inter-layer insulators 24, 23, and 22 and the third, second, and first barrier layers 27, 26, and 25 in the horizontal direction. The propagation of peeling H from the dicing line L will, however, be terminated by the cracking stopper groove 41. No further propagation of the peeling H beyond the cracking stopper groove 41 toward the device region A is caused. The cracking stopper groove 41 prevents the peeling H to propagate into the device region A. The cracking stopper groove 41 protects the device region A from the propagation of the peeling H.

The electrode layer 31 is distanced from the dicing line L. Thus, the dicing process does not provide any damage to the electrode layer 31 or does not cut or remove the electrode layer 31, thereby allowing the electrode layer 31 to perform as the test terminal of the semiconductor chip that has been diced from the semiconductor wafer 1.

As described above, the cracking stopper groove 41 can be formed by removing the contact plug 32 and the first-level, second-level and third-level interconnections 28a, 28b, and 28c in the dicing region B. Thus, the cracking stopper groove 41 will have substantially the same width as the widths of the contact plug 32 and the first-level, second-level and third-level interconnections 28a, 28b, and 28c in the dicing region B. Providing the cracking stopper groove 41 will not reduce the effective area of the device region A, and will prevent reduction of the number of semiconductor chips obtained from the single semiconductor wafer 1.

As described above, the multi-level interconnections 28 in the device region A are covered by the electrode layer 31. The electrode layer 31 protects the multi-level interconnections 28 in the device region A from being etched by the etching process. The electrode layer 31 performs as a protective layer that protects the multi-level interconnections 28 in the device region A from being etched by the etching process. The electrode layer 31 performs as a bonding pad and a test terminal after the semiconductor chip has been diced from the semiconductor wafer.

The dicing saw D cuts into the semiconductor wafer 1 along the dicing line L, while cracks K and/or peeling H may often be caused at the dicing line L as shown in FIG. 10. The cracks K will propagate through the fourth, third, and second inter-layer insulators 24, 23, and 22 in the horizontal direction mainly. The cracking stopper groove 41 stops or terminates any further propagation of crack K toward the device region A, thereby causing no further propagation of the crack K beyond the cracking stopper groove 41 toward the device region A. The cracking stopper groove 41 prevents the cracks K from propagating into the device region A. The cracking stopper groove 41 protects the device region A from the propagation of the cracks K. The peeling H will propagate through the interfaces between the fourth, third, and second inter-layer insulators 24, 23, and 22 and the third, second, and first barrier layers 27, 26, and 25 in the horizontal direction. The cracking stopper groove 41 stops or terminates any further propagation of peeling H from the dicing line L, thereby causing no further propagation of the peeling H beyond the cracking stopper groove 41 toward the device region A. The cracking stopper groove 41 prevents the peeling H from propagating into the device region A. The cracking stopper groove 41 protects the device region A from the propagation of the peeling H. Prevention of any crack or peeling does not deteriorate the moisture-resistance or water-resistance.

In plan view, the cracking stopper groove 41 surrounds the device region A. The cracking stopper groove 41 extends along the circumference of the device region A. The dicing line L surrounds the cracking stopper groove 41 that surrounds the device region A. The dicing line L extends along the circumference of the cracking stopper groove 41 that extend along the circumference of each device region A. The cracking stopper groove 41 extends inside the dicing line L and outside the device region A. The cracking stopper groove 41 extends between the dicing line L and each device region A. In vertical view, the cracking stopper groove 41 penetrates the fourth inter-layer insulator 24, the third barrier layer 27, the third inter-layer insulator 23, the second barrier layer 26, the second inter-layer insulator 22, and the first barrier layer 25, and reaches the first inter-layer insulator 21. The cracking stopper groove 41 can stop or terminate the propagation of crack and/or peeling that is caused at the dicing line L by the dicing saw D.

The cracking stopper groove 41 can be formed by removing the contact plug 32 and the multi-level interconnections 28 in the dicing region B. Thus, the cracking stopper groove 41 will have substantially the same width as the widths of the contact plug 32 and the multi-level interconnections 28 in the dicing region B. Providing the cracking stopper groove 41 will not reduce the effective area of the device region A, and will prevent reduction of the number of semiconductor chips obtained from the single semiconductor wafer 1. The multi-level interconnections 28 and the contact plug 32 in the dicing region B are formed in the common processes to the multi-level interconnections 28 and the contact plug 32 in the device region A. In this case, the position of the cracking stopper groove 41 in the dicing region B is determined at the same process for forming the multi-level interconnections 28 and the contact plug 32 in the device region A. Usually, there appears to be risen no problem of alignment margin between the groove 41 in the dicing region B and the multi-level interconnections 28 and the contact plug 32 in the device region A.

The electrode layer 31 is distanced from the dicing line L. Thus, the dicing process does not provide any damage to the electrode layer 31 or does not cut or remove the electrode layer 31, thereby allowing the electrode layer 31 to perform as the test terminal of the semiconductor chip that has been diced from the semiconductor wafer 1.

The electrode layer 31 is used as a mask to etch the multi-level interconnections 28 and the contact plug 32 in the dicing region B without carrying out any additional process for providing an additional mask. The process for forming the semiconductor wafer is simplified.

The multi-level interconnections 28 and the contact plug 32 in the dicing region B is etched, while the multi-level interconnections 28 and the contact plug 32 in the device region A is protected by the electrode layer 31.

The position of the multi-level interconnections 28 and the contact plug 32 in the dicing region B is flexible as long as the position of the multi-level interconnections 28 and the contact plug 32 in the dicing region B is in the dicing region B, or outside the device region A and inside the dicing line L. This may keep high flexibility of layout of interconnections.

In some cases, the electrode layer 31 is made of Al, and the multi-level interconnections 28 and the contact plug 32 are made of Cu, and an etchant of nitric acid is used to carry out a wet etching process, so that the etchant of nitric acid removes the multi-level interconnections 28 and the contact plug 32 of Cu, without etching the electrode layer 31 of Al. This allows that the cracking stopper groove 41 is formed, while the multi-level interconnections 28 and the contact plug 32 in the device region A are protected by the electrode layer 31.

Instead of the damascene method, the multi-level interconnections 28 and the contact plugs 32 may be formed by a chemical vapor deposition method or a sputtering method.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A method of forming a semiconductor device, the method comprising:
    forming a stack of inter-layer insulators extending over a device region and a dicing region of a semiconductor substrate;
    forming first and second multi-level interconnection structures in the stack of inter-layer insulators, the first multi-level interconnection structure being positioned in the device region, the second multi-level interconnection structure being positioned in the dicing region;
    forming an electrode layer over the stack of inter-layer insulators formed; and
    removing the second multi-level interconnection structure by carrying out a selective wet etching process using the electrode layer as a mask to etch the second multi-level interconnection structure, thereby forming the cracking stopper groove in the dicing region while leaving the first multi-level interconnection structure in the device region.

2. The method according to claim 1, wherein the electrode layer comprises a first material, and the second multi-level interconnection structures comprises a second material, and the wet etching process is carried out using an etchant that dissolves the second material and does not dissolve the first material.

3. The method according to claim 1, wherein the first and second multi-level interconnection structures are formed by a damascene method.

4. The method according to claim 1, wherein at least one of the inter-layer insulators other than the upper most inter-layer insulator has a dielectric constant of less than 3.9.

5. The method according to claim 1, wherein the cracking stopper groove surrounds the device region and the cracking stopper groove is surrounded by a dicing line of the semiconductor wafer.

6. The method according to claim 1, wherein the first and second multi-level interconnection structures comprise adjacent structures on the device, and are separated only by materials of the stack of inter-layer insulators.

7. The method according to claim 1, further comprising forming a passivation layer on a surface and side walls of the electrode layer.

8. The method according to claim 1, further comprising using at least a portion of the electrode layer as a test terminal and a bonding pad.

9. The method according to claim 1, further comprising:
    forming a passivation layer over the electrode layer; and
    selectively providing an opening in the passivation layer to permit the electrode layer to serve as a test terminal and a bonding pad.

10. The method according to claim 2, wherein the first material is Al and the second material is Cu, and the etchant is a nitric acid.

11. The method according to claim 7, further comprising dicing said device from a wafer used to fabricate said device.

* * * * *